(12) United States Patent
Ervin et al.

(10) Patent No.: US 8,133,781 B2
(45) Date of Patent: Mar. 13, 2012

(54) METHOD OF FORMING A BURIED PLATE BY ION IMPLANTATION

(75) Inventors: Joseph Ervin, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/705,768

(22) Filed: Feb. 15, 2010

(65) Prior Publication Data

US 2011/0201161 A1 Aug. 18, 2011

(51) Int. Cl.
*H01L 21/8242* (2006.01)
*H01L 21/20* (2006.01)
*H01L 21/425* (2006.01)

(52) U.S. Cl. ........ 438/243; 438/247; 438/390; 438/524; 257/E21.337; 257/E21.651; 257/E21.653

(58) Field of Classification Search .................. 438/243, 438/247, 390, 524; 257/E21.337, E21.651, 257/E21.653
See application file for complete search history.

(56) References Cited

U.S. PATENT DOCUMENTS

| | | | |
|---|---|---|---|
| 5,153,813 A | 10/1992 | Oehrlein et al. | |
| 5,662,768 A | 9/1997 | Rostoker | |
| 6,020,091 A * | 2/2000 | Lee | 430/5 |
| 6,255,682 B1 * | 7/2001 | Wu | 257/301 |
| 6,350,653 B1 * | 2/2002 | Adkisson et al. | 438/258 |
| 6,426,252 B1 * | 7/2002 | Radens et al. | 438/243 |
| 6,794,706 B2 * | 9/2004 | Chen et al. | 257/310 |
| 6,933,215 B2 * | 8/2005 | Bromberger et al. | 438/527 |
| 7,193,262 B2 | 3/2007 | Ho et al. | |
| 7,388,244 B2 | 6/2008 | Ho et al. | |
| 7,808,028 B2 * | 10/2010 | Cheng | 257/301 |
| 2003/0122188 A1 * | 7/2003 | Blanchard | 257/341 |
| 2003/0207531 A1 * | 11/2003 | Lin | 438/243 |
| 2005/0224852 A1 * | 10/2005 | Cheng et al. | 257/296 |
| 2008/0248625 A1 | 10/2008 | Cheng et al. | |
| 2008/0258268 A1 | 10/2008 | Cheng | |
| 2009/0095998 A1 * | 4/2009 | Ho et al. | 257/301 |
| 2009/0230508 A1 | 9/2009 | Dyer et al. | |
| 2009/0256185 A1 * | 10/2009 | Cheng et al. | 257/301 |
| 2010/0252873 A1 * | 10/2010 | Cheng | 257/301 |

* cited by examiner

*Primary Examiner* — Walter L Lindsay, Jr.
*Assistant Examiner* — Ron Pompey
(74) *Attorney, Agent, or Firm* — Scully, Scott, Murphy & Presser, P.C.; Joseph P. Abate, Esq.

(57) ABSTRACT

A mask layer formed over a semiconductor substrate is lithographically patterned to form an opening therein. Ions are implanted at an angle that is normal to the surface of the semiconductor substrate through the opening and into an upper portion of the semiconductor substrate. Straggle of the implanted ions form a doped region that laterally extends beyond a horizontal cross-sectional area of the opening. A deep trench is formed by performing an anisotropic etch of a semiconductor material underneath the opening to a depth above a deep end of an implanted region. Ion implantation steps and anisotropic etch steps are alternately employed to extend the depth of the doped region and the depth of the deep trench, thereby forming a doped region around a deep trench that has narrow lateral dimensions. The doped region can be employed as a buried plate for a deep trench capacitor.

18 Claims, 12 Drawing Sheets

METHOD OF FORMING A BURIED PLATE
BY ION IMPLANTATION

BACKGROUND

The present invention relates to a method of forming a semiconductor structure, and particularly to a method of forming a semiconductor structure including a buried plate around a deep trench employing an alternating series of ion implantation and incremental extension of depth of the deep trench.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Deep trench capacitors are formed in a semiconductor substrate, which can be a semiconductor-on-insulator (SOI) substrate or a bulk substrate. Other semiconductor devices such as field effect transistors can be formed on the same semiconductor substrate, thereby enabling embedding of deep trench capacitors into a semiconductor chip. Such embedded deep trench capacitors enable various functionality including embedded dynamic access memory (eDRAM) and other embedded electronic components requiring a capacitor.

As the size of an opening of a deep trench decreases scaling, the aspect ratio of the deep trench increases. Thus, formation of a buried plate by angled ion implantation into sidewalls of a deep trench becomes more difficult with the increase in the aspect ratio of the deep trench. There are two factors that render difficult formation of a buried plated by direct angled ion implantation into sidewalls of the deep trench. The first factor is that a high aspect ratio of the deep trench limits the amount of implanted ions that reach a lower portion of the deep trench. This is because even a small angular variation from normal incidence in the direction of the implanted ions tends to send the ions to the upper portion of the deep trench when the aspect ratio is high. The second factor is that a spacer to absorb implanted ions needs to be provided to protect a top semiconductor layer in an SOI substrate or a top portion of a bulk substrate during ion implantation. The spacer reduces the dimension of the opening in the upper portion of the deep trench, thereby limiting the ion implantation angle even more.

Methods of forming a buried plate without employing ion implantations as known in the art include gas phase doping, solid source doping, and depositing a metal plate. Such methods tend to employ complex processing schemes and costly to implement.

BRIEF SUMMARY

In one embodiment of the present invention, a mask layer formed over a semiconductor substrate is lithographically patterned to form an opening therein. Ions are implanted at an angle that is normal to the surface of the semiconductor substrate through the opening and into an upper portion of the semiconductor substrate. Straggle of the implanted ions form a doped region that laterally extends beyond a horizontal cross-sectional area of the opening. A deep trench is formed by performing an anisotropic etch of a semiconductor material underneath the opening to a depth above a deep end of an implanted region. Additional dopant ion implantation is performed to extend the implanted region beneath a bottom surface of the deep trench. The deep trench is vertically extended by another anisotropic etch that removes more semiconductor material from the semiconductor substrate to a depth above a deep end of the extended implanted region. Ion implantation steps and anisotropic etch steps are alternately employed to extend the depth of the doped region and the depth of the deep trench, thereby forming a doped region around a deep trench that has narrow lateral dimensions. The doped region can be employed as a buried plate for a deep trench capacitor.

According to an aspect of the present invention, a method of forming a semiconductor structure is provided, which includes forming a mask layer over a semiconductor substrate; forming an opening in the mask layer by patterning the mask layer; implanting first dopant ions through the opening into a first portion of the semiconductor substrate, whereby a first doped region is formed underneath the opening; forming a trench through a portion of the first doped region by an anisotropic etch, wherein the trench extends downward from the opening; and implanting second dopant ions through a bottom surface of the trench into a second portion of the semiconductor substrate, wherein a second doped region is formed underneath the first doped region such that the second doped region and the first doped region are contiguous with each other.

In one embodiment, the method can further include extending the trench downward through a portion of the second doped region by a second anisotropic etch and performing a combination of processing steps at least once after the extending the trench downward. The combination of processing steps can include implanting additional dopant ions through a bottom surface of the trench into another portion of the semiconductor substrate, whereby another doped region is formed underneath the first and second doped region such that the other doped region is contiguously connected to the first doped region through at least one doped region; and extending the trench downward through a portion of the other doped region by an additional anisotropic etch. Optionally, the combination of processing steps can be repeated at least twice.

DETAILED DESCRIPTION

Figure 1:
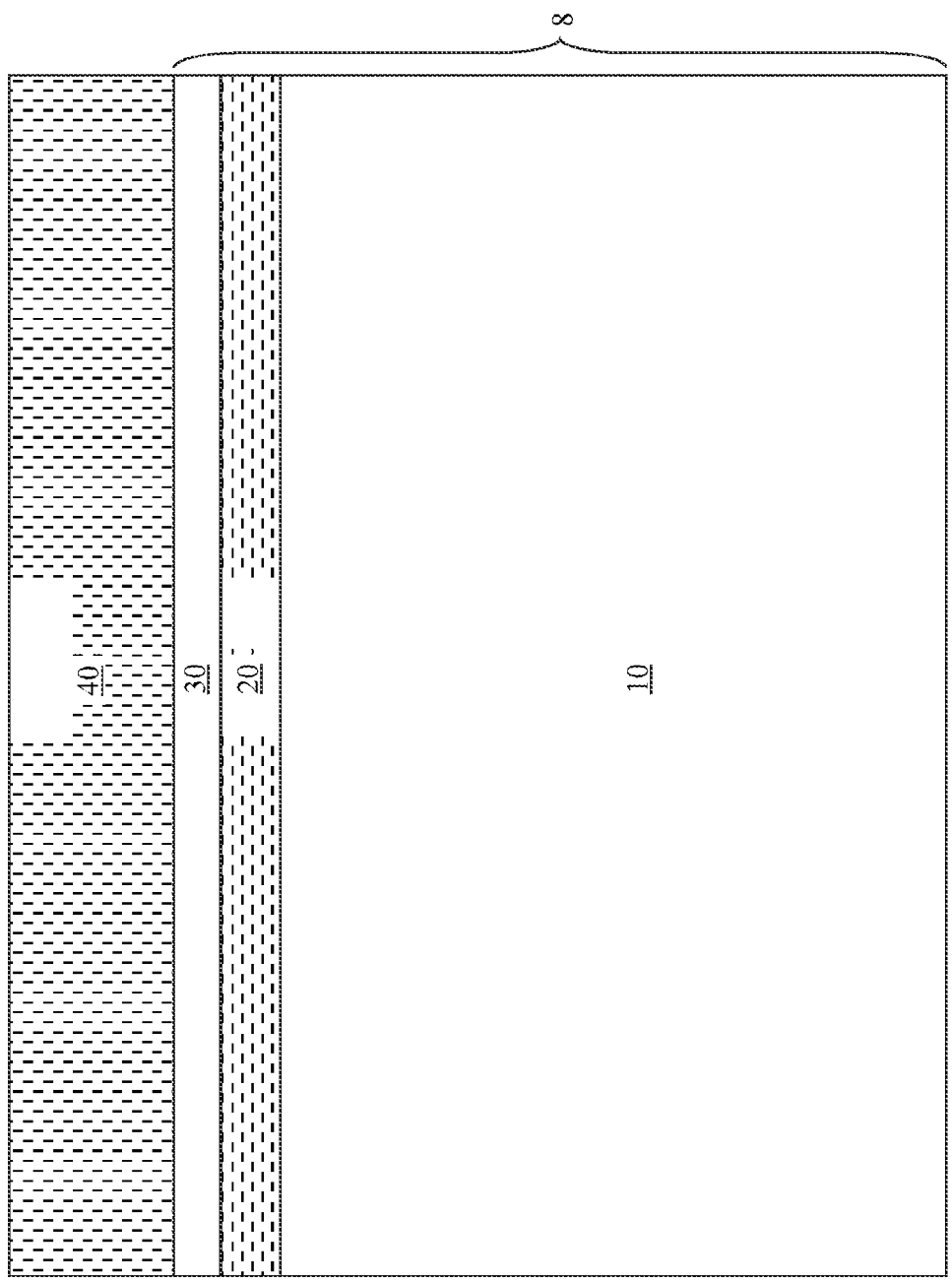
FIG. 1 is a vertical cross-sectional view of a first exemplary semiconductor structure after formation of a mask layer on a semiconductor-on-insulator substrate according to a first embodiment of the present invention.

As stated above, the present invention relates to a method of forming a buried plate around a deep trench by employing a repetition of ion implantation and extension of a depth of the deep trench, which is now described in detail with accompanying figures. It is noted that like reference numerals refer to like elements across different embodiments. The drawings are not necessarily drawn to scale.

As used herein, an "implantation depth" refers to a maximum distance that implanted ions move within a structure from an interface between a vacuum environment and the structure along the direction of a beam of ions in the vacuum environment immediately before impinging at the interface.

As used herein, a "deep trench" is a trench that extends from a top surface of a semiconductor-on-insulator substrate to a depth below a bottom surface of a buried insulator layer as applied to a semiconductor-on-insulator substrate, or a trench that extends from a top surface of a bulk substrate and having a depth greater than 1 micron.

Referring to FIG. 1, a first exemplary semiconductor structure according to a first embodiment of the present invention includes a semiconductor-in-insulator (SOI) substrate 8 and a mask layer 40 formed on a top surface thereupon. The SOI substrate 8 is a semiconductor substrate that includes at least one semiconductor material portion. Specifically, the SOI substrate 8 includes, from bottom to top, a bottom semiconductor layer 10, a buried insulator layer 20, and a top semiconductor layer 30. Each of the top semiconductor layer 30 and the bottom semiconductor layer 10 comprises a semiconductor material. The semiconductor material of the top semiconductor layer 30 and the semiconductor material of the bottom semiconductor layer 10 may be the same, or different. The semiconductor materials for the top semiconductor layer 30 and the bottom semiconductor layer 10 may be selected from, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor materials comprise silicon.

Preferably, the top semiconductor layer 30 is composed of a single crystalline material having an epitaxial alignment throughout an entirety of the top semiconductor layer 30. However, embodiments in which the top semiconductor layer 30 and/or the bottom semiconductor layer 10 comprise at least one polycrystalline or amorphous semiconductor material can also be employed as well. Preferably, the bottom semiconductor layer 10 is also composed of a single crystalline material having an epitaxial alignment throughout an entirety of the bottom semiconductor layer 10. The bottom semiconductor layer 10 has a doping of a first conductivity type at a dopant concentration from $1.0 \times 10^{14}/cm^3$ to $1.0 \times 10^{19}/cm^3$, and typically from $1.0 \times 10^{14}/cm^3$ to $1.0 \times 10^{17}/cm^3$. While the present invention is described with an SOI substrate 8, implementation of the present invention in an SOI portion of a hybrid substrate is explicitly contemplated herein. The thickness of the top semiconductor layer 30 may be from 10 nm to 500 nm, and typically from 30 nm to 100 nm, although lesser and greater thicknesses are contemplated herein also.

The buried insulator layer 20 vertically contacts a top surface of the bottom semiconductor layer 10 and a bottom surface of the top semiconductor layer 30. The buried insulator layer 20 comprises a dielectric material such as silicon oxide, silicon nitride, silicon oxynitride, or a stack thereof. Typically, the buried insulator layer 20 comprises silicon oxide. The thickness of the buried insulator layer 20 may be from 10 nm to 500 nm, and typically from 60 nm to 300 nm, although lesser and greater thickness are contemplated herein also.

The mask layer 40 is formed on the top surface of the top semiconductor layer 30. The mask layer 40 can be composed of a dielectric oxide, a dielectric nitride, a dielectric oxynitride, or a combination thereof. The dielectric oxide can be undoped silicate glass or a doped silicate glass such as borosilicate glass (BSG), borophosphosilicate glass (BPSG), phosphosilicate glass (PSG), a fluorosilicate glass (FSG), or a combination thereof. Examples of the dielectric nitride and the dielectric oxynitride include silicon nitride and silicon oxynitride. The mask layer 40 can include a stack of a silicon oxide layer (not shown separately) contacting a top surface of the top semiconductor layer 30 and a silicon nitride layer (not shown separately) located directly on the silicon oxide layer. Typically, the mask layer 40 may be formed by chemical vapor deposition (CVD) such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc. The thickness of the mask layer 40 can be from 500 nm to 3,000 nm, and typically from 800 nm to 1,500 nm, although lesser and greater thicknesses can also be employed.

Figure 2:
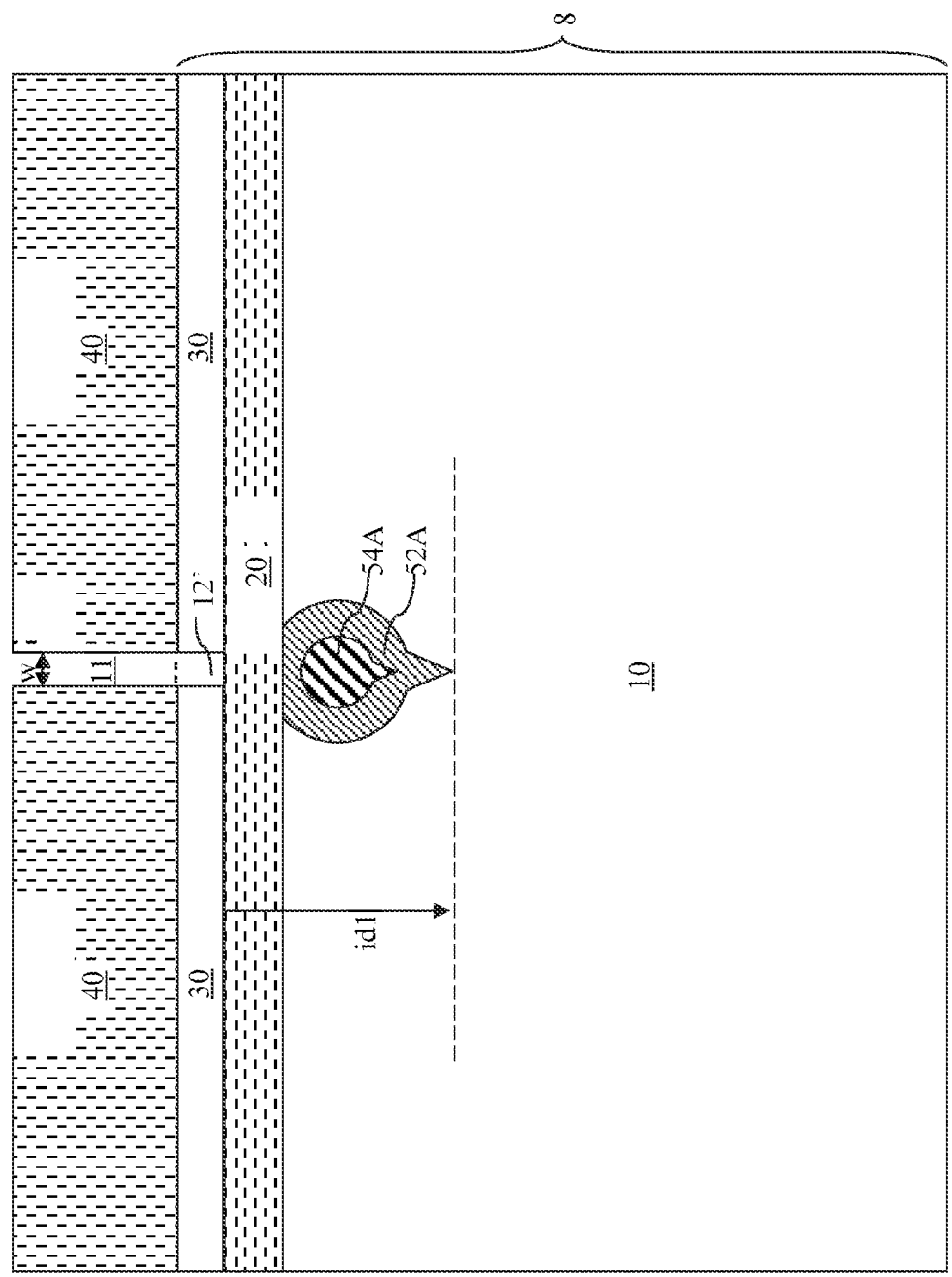
FIG. 2 is a vertical cross-sectional view of the first exemplary semiconductor structure after formation of an opening in the mask layer, formation of a trench in a top semiconductor layer, and a first dopant ion implantation according to the first embodiment of the present invention.

Referring to FIG. 2, a photoresist (not shown) is applied over the masking layer 40. A lithographic pattern including at least one opening is formed in the photoresist by lithographic exposure and development. A horizontal cross-sectional shape of each of the at least one opening can be a circle, an ellipse, a polygon, or a derivative a polygon derived by rounding corners thereof. A characteristic lateral dimension of the shape of each opening is limited by the printing capability of a lithographic tool employed to pattern the opening. The characteristic lateral dimension can be a diameter of a circle, a minor axis of an ellipse, a distance between two facing sides of a polygon or a derivative thereof, or a distance that can otherwise characterize a separation distance between different sides of the shape.

The pattern of each opening in the photoresist is transferred by an anisotropic etch into the mask layer 40 to form an opening 11 having a width w within the mask layer 40. During the anisotropic etch that removed exposed portions of the mask layer 40, the photoresist is employed as an etch mask. The width w of an opening 11 in the mask layer 40 is typically comparable with the characteristic lateral dimension of an overlying opening in the photoresist. The width w of the opening 11 in the mask layer 40 can be from 40 nm to 200 nm, which is also the characteristic lateral dimension of the overlying opening in the photoresist. The photoresist is subsequently removed selective to the mask layer 40, for example, by ashing. While the present invention is described employing a single opening 11 in the mask layer 40, embodiments in which multiple openings are formed to laterally replicate the first exemplary structure of the present invention are also contemplated herein.

Optionally, the pattern in the mask layer 40 can be further transferred into the top semiconductor layer 30, for example, by another anisotropic etch. A portion of the top semiconductor layer 30 is removed from underneath the opening 11 during the anisotropic etch to form a trench 12' therein. The anisotropic etch of the top semiconductor layer 30 can be performed either before or after removal of the photoresist. If the pattern in the mask layer 40 is transferred into the top semiconductor layer before removal of the photoresist, the photoresist functions an etch mask. If the pattern in the mask layer 40 is transferred into the top semiconductor layer after removal of the photoresist, the mask layer 40 functions an etch mask. The buried insulator layer 30 can be employed as a stopping layer for the anisotropic etch. The trench 12' is a shallow trench that vertically extends from a top surface of the top semiconductor layer 30 to a bottom surface of the top semiconductor layer 30. The depth of the trench 12' as measured from the top surface of the top semiconductor layer 30 can be the same as the thickness of the top semiconductor layer 30.

Dopant ions are implanted in an ion implantation step through the opening 11 and the trench 12' into a lower portion of the buried insulator layer 20 and an upper portion of the bottom semiconductor layer 10. The implanted dopant ions are herein referred to as first dopant ions, and the ion implantation step is herein referred to as a first dopant ion implantation step. The first dopant ions are ions of dopant atoms or dopant molecules that can generate holes or electrons in the semiconductor material of the bottom semiconductor layer 10. For example, the first dopant ions can be ions of B, Ga, In, P, As, Sb, or ions of a compound including at least one of B, Ga, In, P, As, Sb and at least another element. An exemplary compound including B is $BF_2$.

The polarity of the first dopant ions is selected to be opposite of the doping type of the bottom semiconductor layer 10. For example, if the bottom semiconductor layer 10 includes a p-doped semiconductor material, ions including n-type dopants such as P, As, and Sb are employed in the first dopant ion implantation step. Conversely, if the bottom semiconductor layer 10 includes an n-doped semiconductor material, ions including p-type dopants such as B, Ga, and In are employed in the first dopant ion implantation step.

The first dopant ions are implanted in a direction that is normal to a top surface of the SOI substrate 8. While the implant angle, i.e., the angle between the impinging first dopant ions and the surface normal of the SOI substrate 8, is nominally zero, non-substantial deviations from normal incidence can be practiced for the first dopant ion implantation step to minimize any adverse effect of channeling of ions as needed. The deviation of the implant angle from the surface normal of the SOI substrate 8 is limited by the requirement that a sufficient quantity of dopants needs to be implanted into the bottom semiconductor layer 10. Thus, the deviation of the implant angle of the first dopant ion implantation step does not exceed the arc-cotangent of the aspect ratio of the combination of the opening 11 and the trench 12', i.e., the angle at which the inverse of the tangent becomes equal to the ratio of the sum of the height of the opening 11 and the trench 12' to the width w of the opening 11.

The implanted dopants form a first doped region having a non-uniform dopant concentration. For example, the first doped region can include a first high-concentration doped region 54A and a first low-concentration doped region 52A such that the lowest dopant concentration in the first high-concentration doped region 54A is the same as the highest dopant concentration in the first low-concentration doped region 52A. The first high-concentration doped region 54A can be encapsulated in the low-concentration doped region 52A. It is understood that the concentration that determines the boundary between the first high-concentration doped region 54A and the first low-concentration doped region 52A is determined by arbitrarily selecting a threshold dopant concentration at the interface between the first high-concentration doped region 54A and the first low-concentration doped region 52A.

The ions can be implanted employing a single ion implantation step employing a target ion implantation energy and a target dose, or can be implanted employing multiple ion implantation steps each having different target ion implantation energy and a target dose. If multiple ion implantation steps having different ion energies are employed, the dopant profile after the multiple ion implantation steps is the superposition of all individual ion implantation steps. The target ion implantation energy can be from 20 keV to 1 MeV, and preferably from 300 keV to 1 MeV, although lesser and greater target ion implantation energies can also be employed.

The highest dopant concentration in the first high-concentration doped region 54A can be from $1.0 \times 10^{19}/cm^3$ to $5.0 \times 10^{21}/cm^3$, and typically from $5.0 \times 10^{19}/cm^3$ to $1.0 \times 10^{21}/cm^3$, although lesser and greater highest dopant concentrations can also be employed. The outer boundary of the first doped region (52A, 54A), which is the boundary of the first low-concentration doped region 52A, forms a p-n junction with the bottom semiconductor layer 10. The first doped region (52A, 54A) is located underneath the opening 11 and the trench 12'. If the implantation angle for the first dopant ion implantation is zero, the first doped region (52A, 54A) is centered around a vertical line that passes through the center of the opening 11 and the trench 12'.

The mask layer 40 has a thickness that is thick enough to prevent implantation of the first dopant ions into the top semiconductor layer 30. The distance between the top surface of the buried insulator layer 20 and the bottommost point of the first doped region (52A, 54A) is herein referred to as a first implantation depth id1. Preferably, the thickness of the mask layer 40 is greater than a first implantation depth d1.

Figure 3:
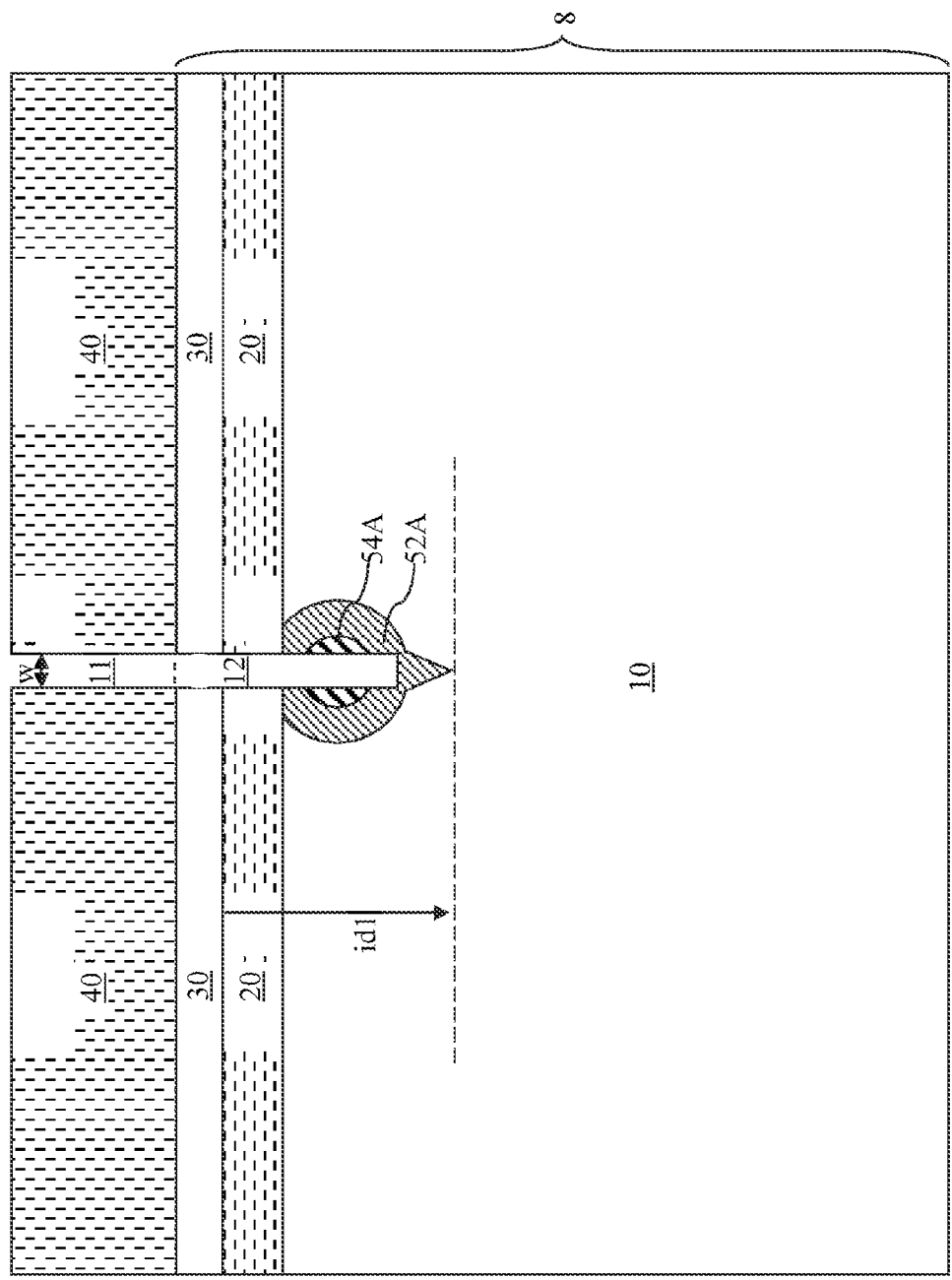
FIG. 3 is a vertical cross-sectional view of a first exemplary semiconductor structure after a first deep trench extension etch according to the first embodiment of the present invention.

Referring to FIG. 3, a first deep trench extension etch is performed to extend the trench 12' (See FIG. 2) downward employing the mask layer 40 as an etch mask. The first deep trench extension etch is an anisotropic etch that forms a deep trench 12 through a portion of the first doped region (52A, 54A). The deep trench 12 extends downward from the bottom of the opening 11, i.e., from the interface between the top semiconductor layer 30 and the mask layer 40. The depth by which the trench 12' is extended to become the deep trench 12 can be a dimension from 500 nm to 2,000 nm, although lesser and greater extension depths can also be employed.

Preferably, the bottom surface of the deep trench 12 is located above the lowest point of the first doped region (52A, 54A). Preferably, all surfaces of the portion of the deep trench 12 below the bottom surface of the buried insulator layer 20 are surfaces of the first doped region (52A, 54A).

Figure 4:
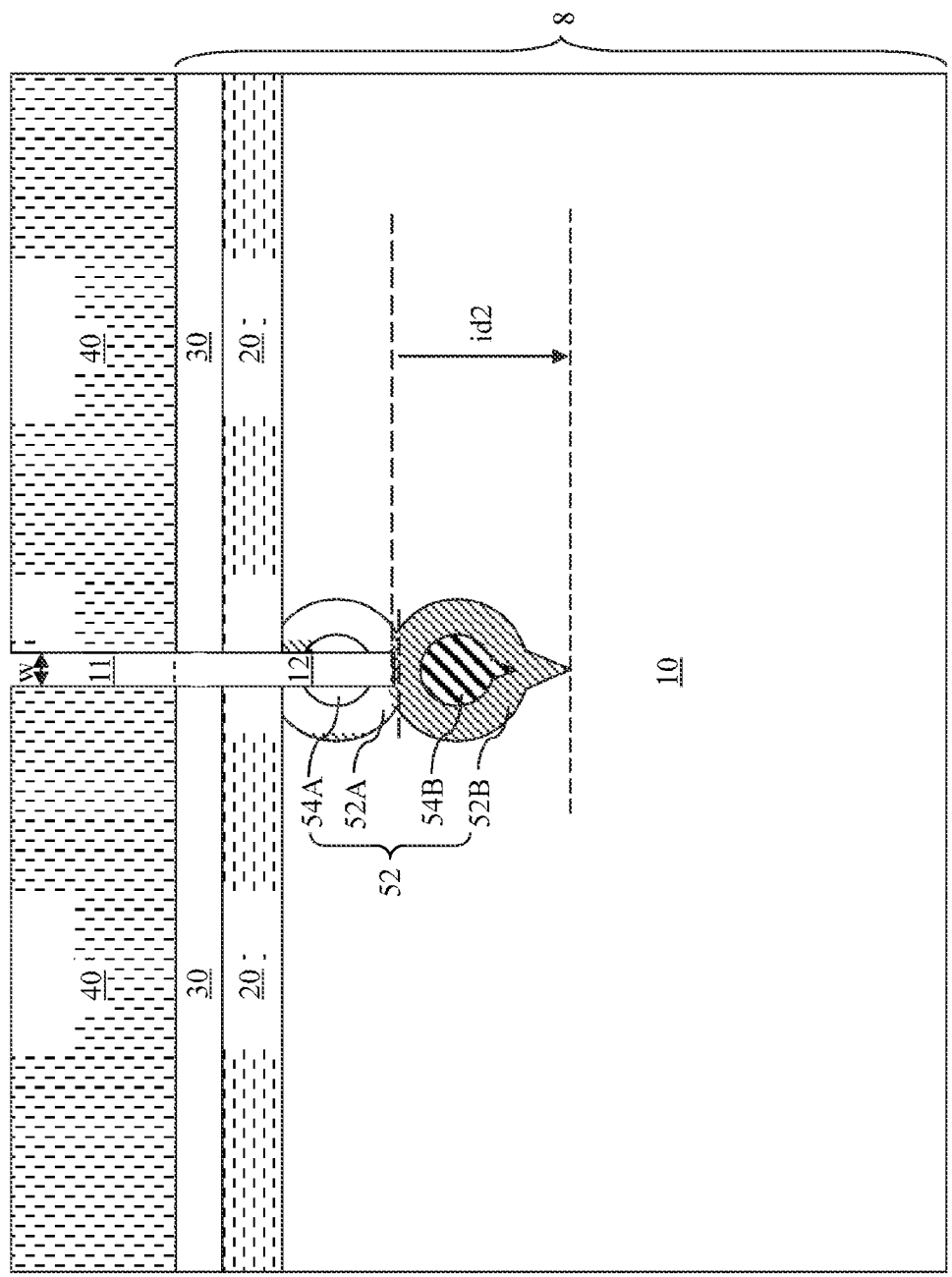
FIG. 4 is a vertical cross-sectional view of the first exemplary semiconductor structure after a second dopant ion implantation according to the first embodiment of the present invention.

Referring to FIG. 4, second dopant ions are implanted through a bottom surface of the deep trench 12 into a portion of the bottom semiconductor layer 10. The ion implantation step is herein referred to as a second dopant ion implantation step. A second doped region is formed underneath the first doped region (52A, 54A). The second doped region includes a second high-concentration doped region 54B and a second low-concentration doped region 52B. The second doped region (52B, 54B) and the first doped region (52A, 54A) are contiguous with each other.

The second dopant ions can be selected from the same ions that can be employed for the first dopant ions. The second dopant ions have the same polarity as the first dopant ions. For example, if the first dopant ions are ions of p-type dopants, the second dopant ions are ions of p-type dopants. Conversely, if the first dopant ions are ions of n-type dopants, the second dopant ions are ions of n-type dopants.

The second dopant ions are implanted in a direction that is normal to a top surface of the SOI substrate 8. While the implant angle, i.e., the angle between the impinging second dopant ions and the surface normal of the SOI substrate 8, is nominally zero, non-substantial deviations from normal incidence can be practiced for the second dopant ion implantation step to minimize any adverse effect of channeling of ions as needed. The deviation of the implant angle from the surface normal of the SOI substrate 8 is limited by the requirement that a sufficient quantity of dopants needs to be implanted through the bottom surface of the deep trench 12. Thus, the deviation of the implant angle of the second dopant ion implantation step does not exceed the arc-cotangent of the aspect ratio of the combination of the opening 11 and the deep trench 12, i.e., the angle at which the inverse of the tangent becomes equal to the ratio of the sum of the height of the opening 11 and the deep trench 12 to the width w of the opening 11.

The implanted dopants form a second doped region having a non-uniform dopant concentration. For example, the second doped region can include a second high-concentration doped region 54B and a second low-concentration doped region 52B such that the lowest dopant concentration in the second high-concentration doped region 54B is the same as the highest dopant concentration in the second low-concentration doped region 52B. The second high-concentration doped region 54B can be encapsulated in the low-concentration doped region 52B. As is the case with the first high-concentration doped region 54A and the first low-concentration doped region 52B, the concentration that determines the boundary between the second high-concentration doped region 54B and the second low-concentration doped region 52B can be determined by arbitrarily selecting a threshold dopant concentration at the interface between the second high-concentration doped region 54B and the low-concentration doped region 52A. In FIG. 4, the concentration that determines the boundary between the second high-concentration doped region 54B and the second low-concentration doped region 52B is set to be the same as the concentration that determines the boundary between the first high-concentration doped region 54A and the first low-concentration doped region 52B.

The ions can be implanted employing a single ion implantation step employing a target ion implantation energy and a target dose, or can be implanted employing multiple ion implantation steps each having different target ion implantation energy and a target dose. If multiple ion implantation steps having different ion energies are employed, the dopant profile after the multiple ion implantation steps is the superposition of all individual ion implantation steps. The target ion implantation energy can be from 20 keV to 1 MeV, and preferably from 300 keV to 1 MeV, although lesser and greater target ion implantation energies can also be employed.

The highest dopant concentration in the second high-concentration doped region 54B can be from $1.0 \times 10^{19}/cm^3$ to $5.0 \times 10^{21}/cm^3$, and typically from $5.0 \times 10^{19}/cm^3$ to $1.0 \times 10^{21}/cm^3$, although lesser and greater highest dopant concentrations can also be employed. The first doped region (52A, 54) and the second doped region (52B, 54B) are collectively referred to as a contiguous doped region 52. The outer boundary of the contiguous doped region 52 forms a p-n junction with the bottom semiconductor layer 10. The contiguous doped region 52 is located underneath the opening 11 and the deep trench 12. If the implantation angle for the second dopant ion implantation is zero, the second doped region (52A, 54A) is centered around a vertical line that passes through the center of the opening 11 and the deep trench 12.

The mask layer 40 has a thickness that is thick enough to prevent implantation of the second dopant ions into the top semiconductor layer 30. The distance between the bottom surface of the deep trench 12 and the bottommost point of the second doped region (52B, 54B) is herein referred to as a second implantation depth id2. Preferably, the thickness of the mask layer 40 is greater than a second implantation depth d2.

Figure 5:
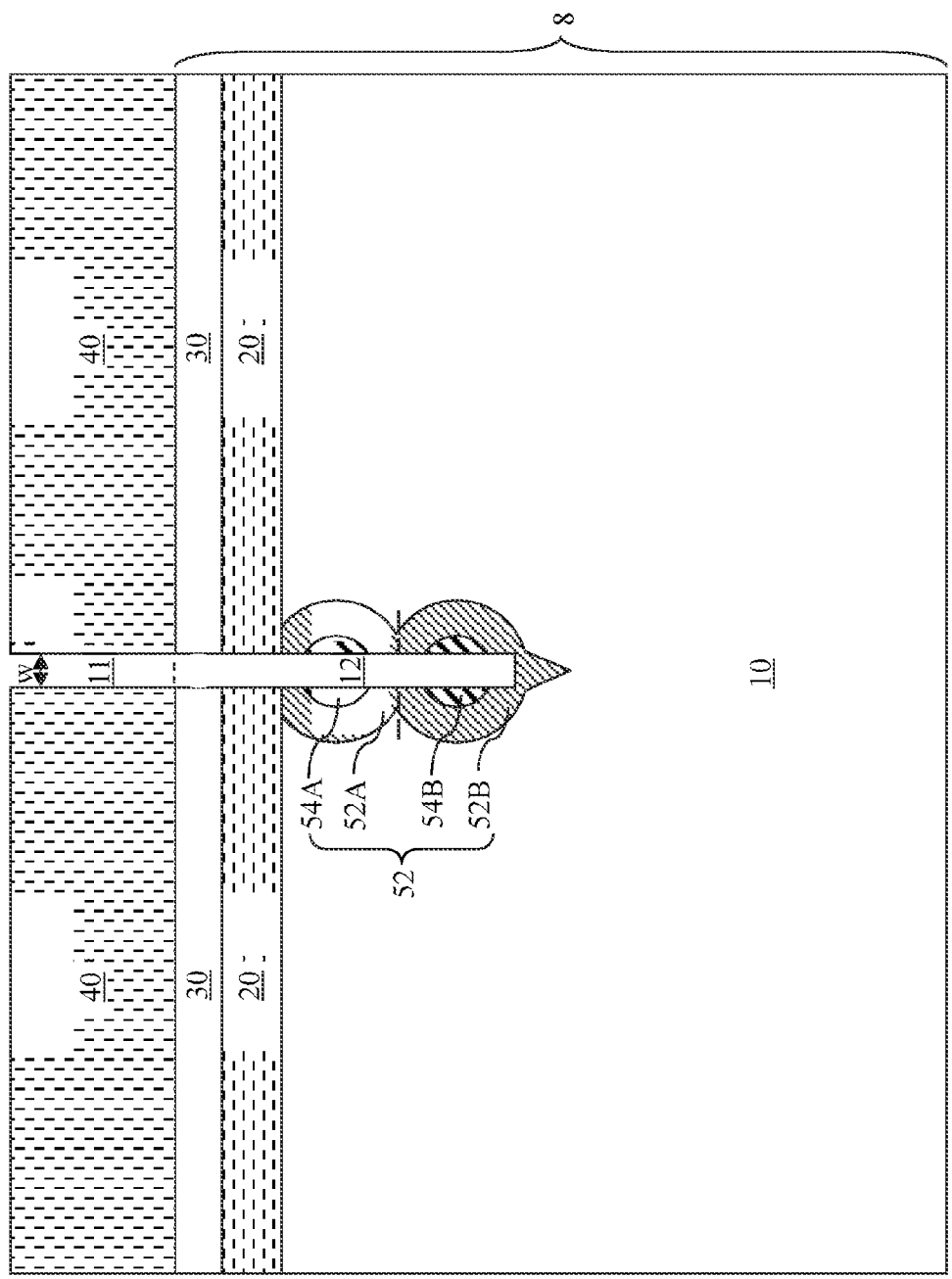
FIG. 5 is a vertical cross-sectional view of the first exemplary semiconductor structure after a second deep trench extension etch according to the first embodiment of the present invention.

Referring to FIG. 5, a second deep trench extension etch is performed to extend the deep trench 12 downward employing the mask layer 40 as an etch mask. The second deep trench extension etch is an anisotropic etch that extends the deep trench 12 through a portion of the second doped region (52B, 54B). The depth by which the deep trench 12 is extended can be a dimension from 500 nm to 2,000 nm, although lesser and greater extension depths can also be employed.

Preferably, the bottom surface of the deep trench 12 is located above the lowest point of the second doped region (52B, 54B). The deep trench 12 is extended downward without forming a step on any sidewall of the deep trench 12.

Figure 6:
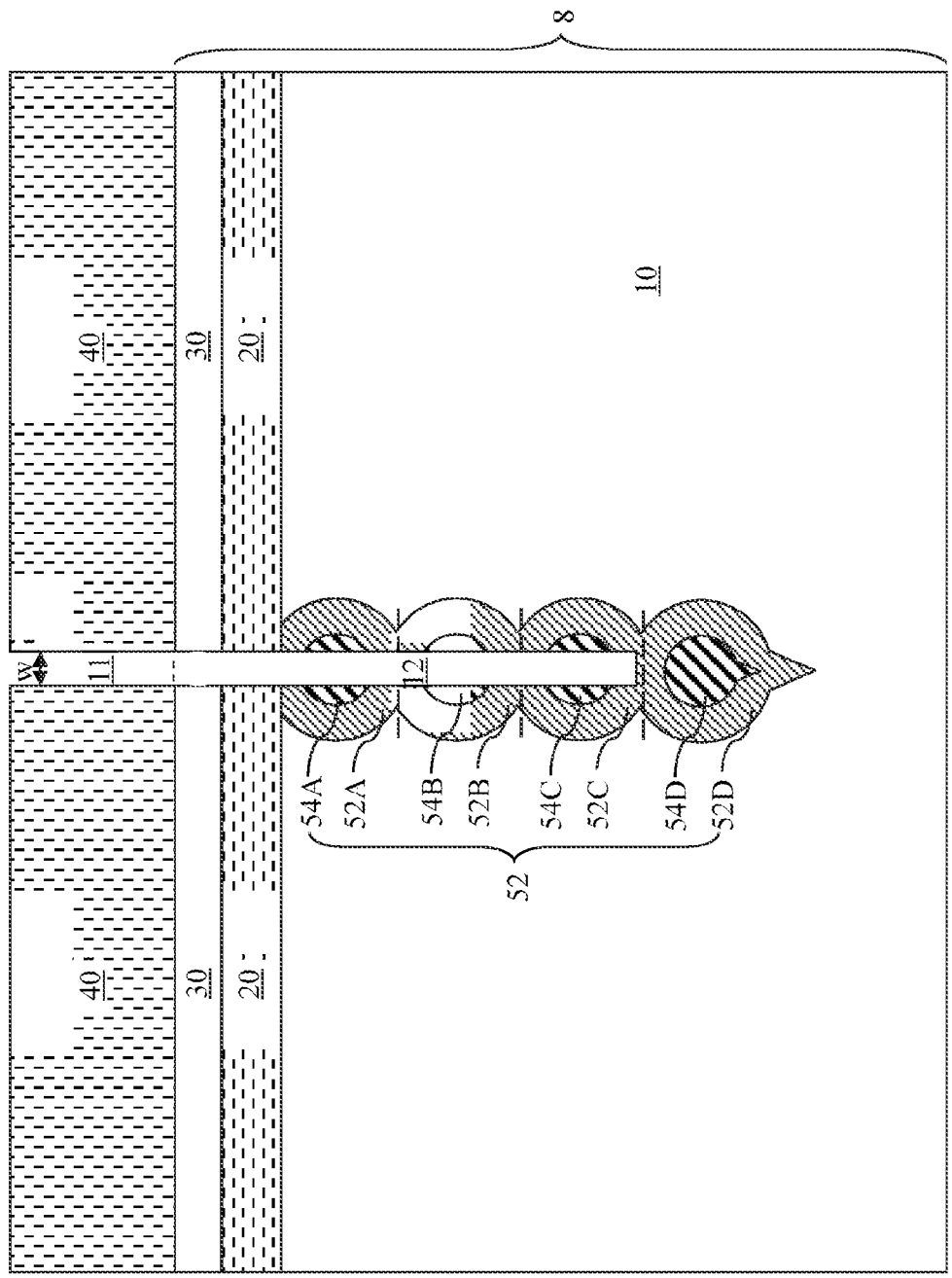
FIG. 6 is a vertical cross-sectional view of the first exemplary semiconductor structure after a third ion implantation, a third deep trench extension etch, and a fourth ion implantation according to the first embodiment of the present invention.

Referring to FIG. 6, a combination of processing steps can be repeated at least once to extend the depth of the contiguous doped region 51 and the depth of the deep trench 12. The combination of processing steps can be repeated as many times as needed provided that ion implantation can generate another doped region below a bottom surface of the deep trench 12.

The combination of processing steps includes an implantation step and an extension etch step. In the implantation step, additional dopant ions are implanted through the bottom surface of the deep trench 12 into another portion of the bottom semiconductor layer 10, whereby another doped region is formed underneath the contiguous doped region 52. The other doped region, i.e., the newly formed doped region, is contiguously connected to the first doped region (52A, 54A) through at least one doped region that includes the second doped region (52B, 54B) and any other doped region that is previously formed. The additional dopants have the same polarity as the dopants in the first and second doped regions (52A, 54A, 52B, 54B). In the extension etch step, the deep trench 12 is extended downward through a portion of the other doped region, i.e., the newly formed doped region, by an additional anisotropic etch. The depth by which the deep trench 12 is extended in each extension etch step can be a dimension from 500 nm to 2,000 nm, although lesser and greater extension depths can also be employed.

While the first exemplary semiconductor structure in FIG. 6 illustrates a structure obtained after a third ion implantation step, a third deep trench extension etch step, and a fourth ion implantation step, embodiments in which a total of (N+1) ion implantation steps and N extension etch steps are employed are explicitly contemplated herein, in which N is an positive integer.

During the ion implantation steps, dopant ions are implanted in a direction that is normal to a top surface of the SOI substrate 8. While the implant angle, i.e., the angle between the impinging dopant ions and the surface normal of the SOI substrate 8, is nominally zero, non-substantial deviations from normal incidence can be practiced for any dopant ion implantation step to minimize any adverse effect of channeling of ions as needed. The deviation of the implant angle from the surface normal of the SOI substrate 8 is limited by the requirement that a sufficient quantity of dopants needs to be implanted through the bottom surface of the deep trench 12. Thus, the deviation of the implant angle of the second dopant ion implantation step does not exceed the arc-cotangent of the aspect ratio of the combination of the opening 11 and the deep trench 12 at the time of the ion implantation. Therefore, the deeper the angle of the ion implantation is, the lesser the deviation of the implanted angle is from the nominal angle of zero.

Figure 7:
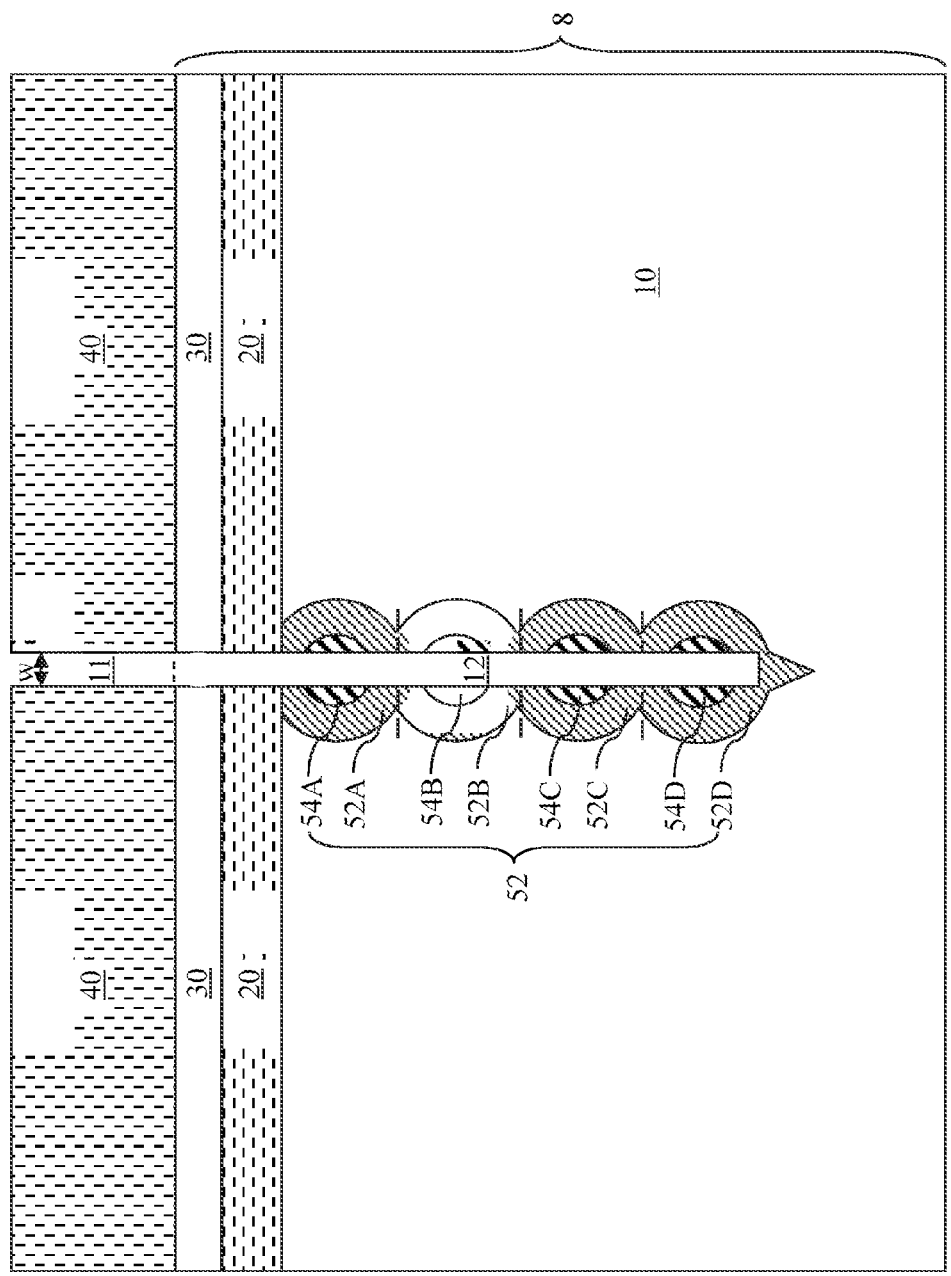
FIG. 7 is a vertical cross-sectional view of the first exemplary semiconductor structure after a fourth deep trench extension etch according to the first embodiment of the present invention.

Referring to FIG. 7, the deep trench 12 is extended downward by a last deep trench extension etch. The last deep trench extension etch is performed to extend the deep trench 12 downward employing the mask layer 40 as an etch mask. The last deep trench extension etch is an anisotropic etch that extends the deep trench 12 through a portion of the most recently formed doped region, which is a fourth doped region (52D, 54D) in the illustrated example. The depth by which the deep trench 12 is extended can be a dimension from 500 nm to 2,000 nm, although lesser and greater extension depths can also be employed.

Preferably, the bottom surface of the deep trench 12 is located above the lowest point of the contiguous doped region 52, which includes a first doped region (52A, 54A), a second doped region (52B, 54B), a third doped region (52C, 54C), and a fourth doped region (52D, 54D). The deep trench 12 is extended downward without forming a step on any sidewall of the deep trench 12. A p-n junction is present at an outer boundary of the contiguous doped region 52.

Figure 8:
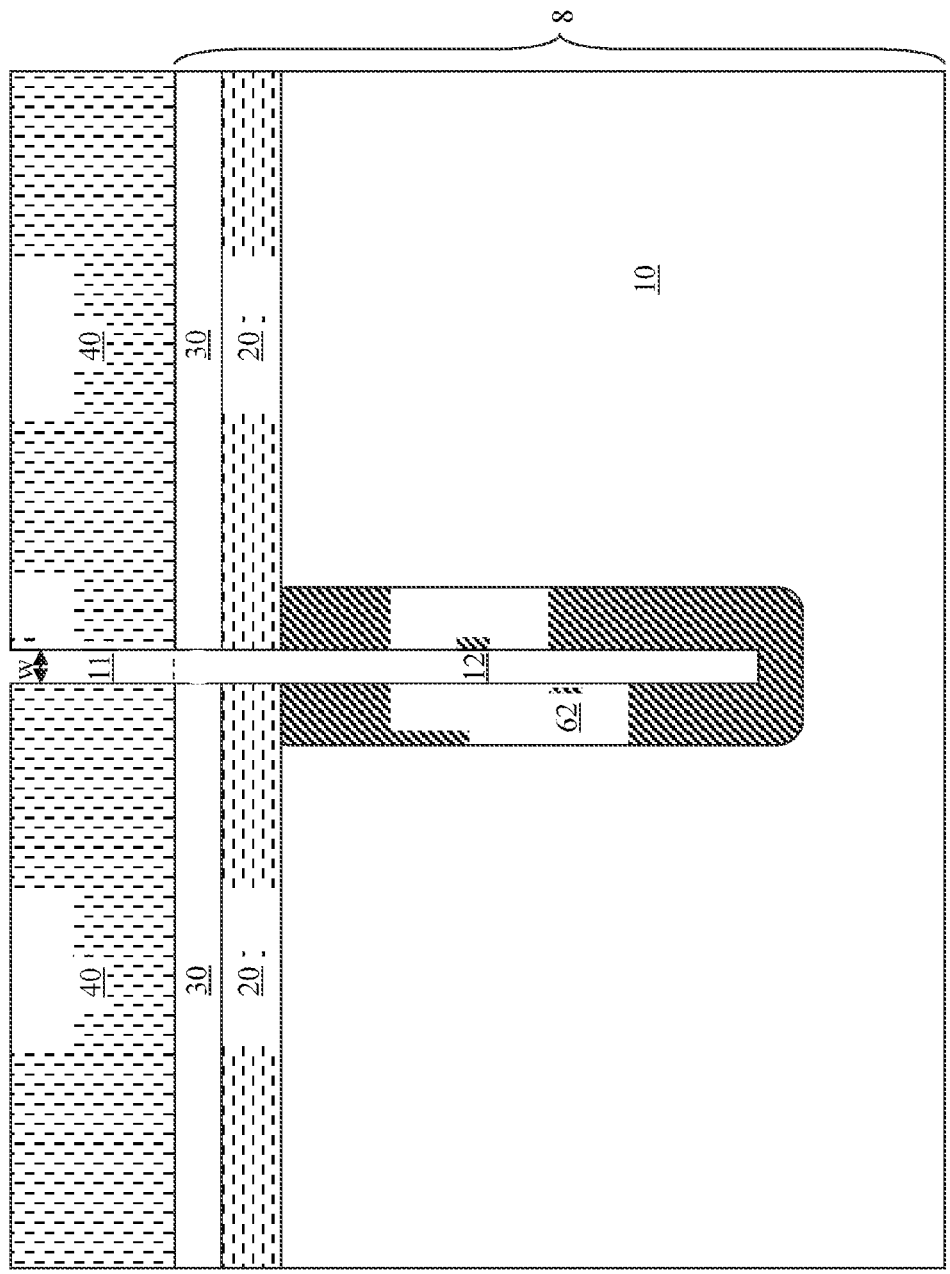
FIG. 8 is a vertical cross-sectional view of the first exemplary semiconductor structure after an activation anneal according to the first embodiment of the present invention.

Referring to FIG. 8, an activation anneal is performed to activate the implanted dopants in the contiguously doped region 52 (See FIG. 7). During the activation anneal, dopant ions in interstitial sites are incorporated into substitutional sites to become electrically active. The temperature of the activation anneal can be from 900° C. to 1,100° C., although lesser and greater activation anneal temperatures can also be employed. Surfaces of the p-n junction between the contiguously doped region 52 and the bottom semiconductor layer 10 becomes smoother during the activation anneal. The doped region including activated dopants from the contiguously doped region 52 is herein referred to as a doped buried plate 62, which forms a p-n junction with the bottom semiconductor layer 10 at an interface which is the smoothed p-n junction formed during the activation anneal.

Figure 9:
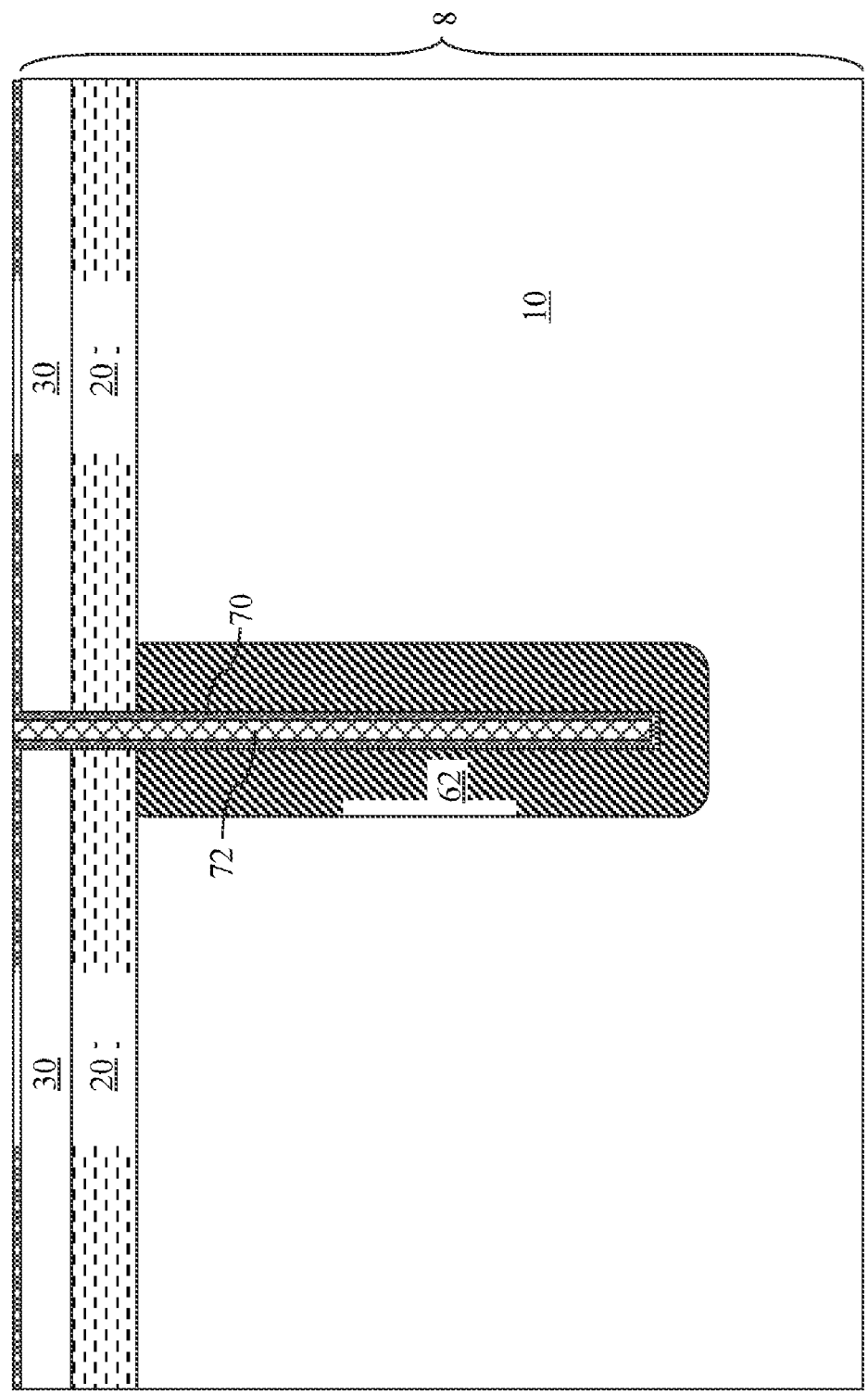
FIG. 9 is a vertical cross-sectional view of the first exemplary semiconductor structure after formation of a node dielectric and a conductive material portion according to the first embodiment of the present invention.

Referring to FIG. 9, a node dielectric 70 and a conductive material portion 72 are formed to fill the deep trench 12 (See FIG. 8) employing methods known in the art. The node dielectric 70 is formed on the sidewalls and the bottom surface of the deep trench 12. The node dielectric 70 can be formed by methods known in the art including, but not limited to, thermal oxidation, thermal nitridation, chemical vapor deposition (CVD), atomic layer deposition (ALD), or a combination of thereof. The node dielectric 70 may comprise silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the node dielectric layer 70 can be from 3 nm to 10 nm, although lesser and greater thickness are also explicitly contemplated herein.

The conductive material portion 72 can include a doped semiconductor material, a metal, a conductive metallic alloy, or a combination thereof. The conductive material portion 72 is formed within the deep trench 12 on sidewalls of the node dielectric 70.

The doped buried plate 62, the node dielectric 70, and the conductive material portion 72 constitute a deep trench capacitor within the SOI substrate 8. The volume of the contiguous doped region 52 at a processing step corresponding to FIG. 7 is included in the volume of the doped buried plate 62, which is a first electrode. The conductive material portion 72 constitutes a second electrode.

Figure 10:
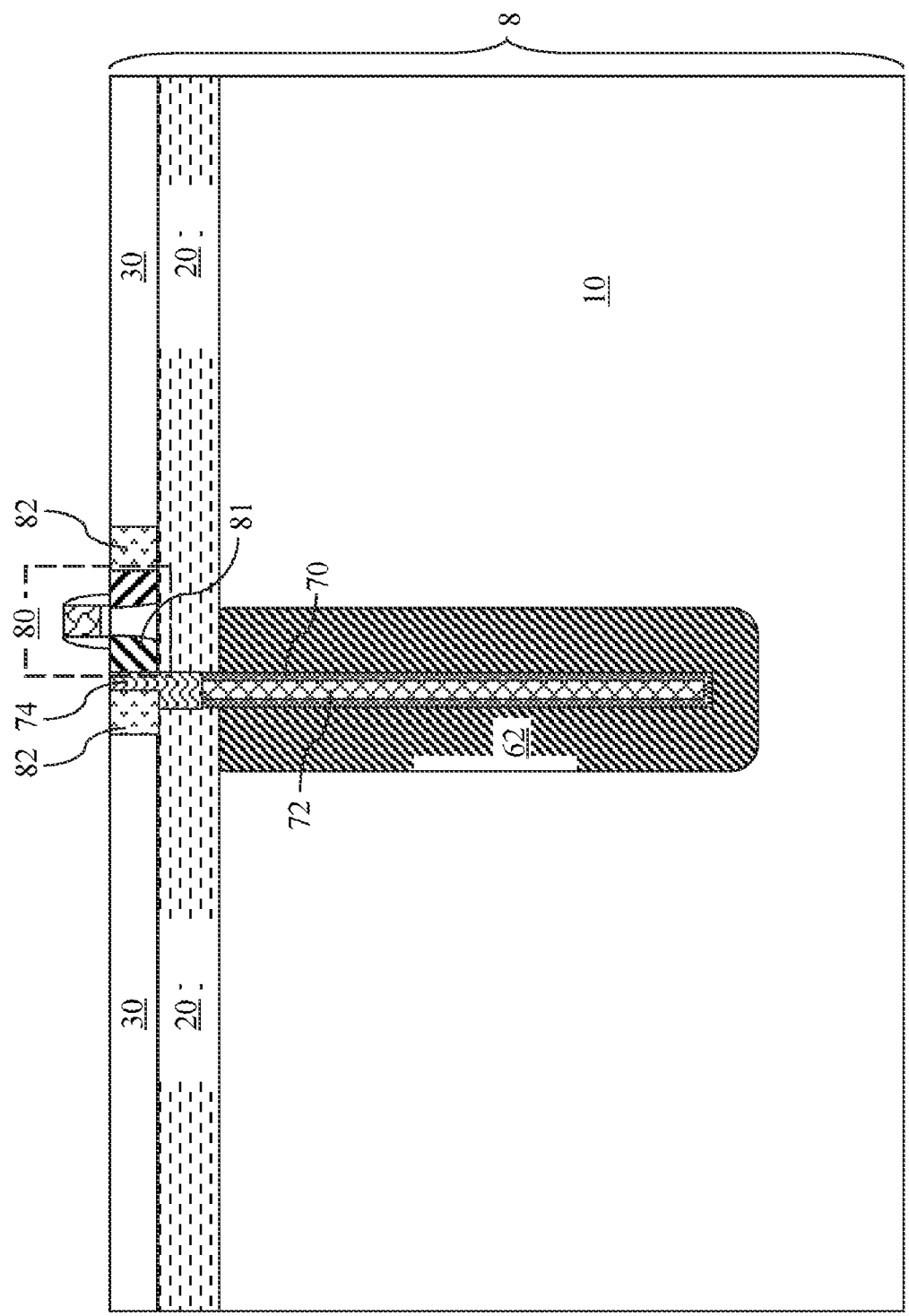
FIG. 10 is a vertical cross-sectional view of the first exemplary semiconductor structure after formation of a field effect transistor electrically connected to a deep trench capacitor according to the first embodiment of the present invention.

Referring to FIG. 10, a field effect transistor 80 electrically connected to the deep trench capacitor (70, 72, 62) is formed. The electrical connection of the field effect transistor 80 to the deep trench capacitor (70, 72, 62) can be effected by a buried strap 72, which includes a conductive material such as a doped semiconductor material, a metal, or a conductive metallic alloy. The buried strap 74 can laterally contact a source region 81 of the field effect transistor 80, thereby providing a conductive connection between the source region 81 and the second electrode of the deep trench capacitor (70, 72, 62), i.e., the conductive material portion 72. Shallow trench isolation structures 82 can be provided within the top semiconductor layer 30 to provide electrical isolation between the field effect transistor 80 and other semiconductor devices (not shown).

Figure 11:
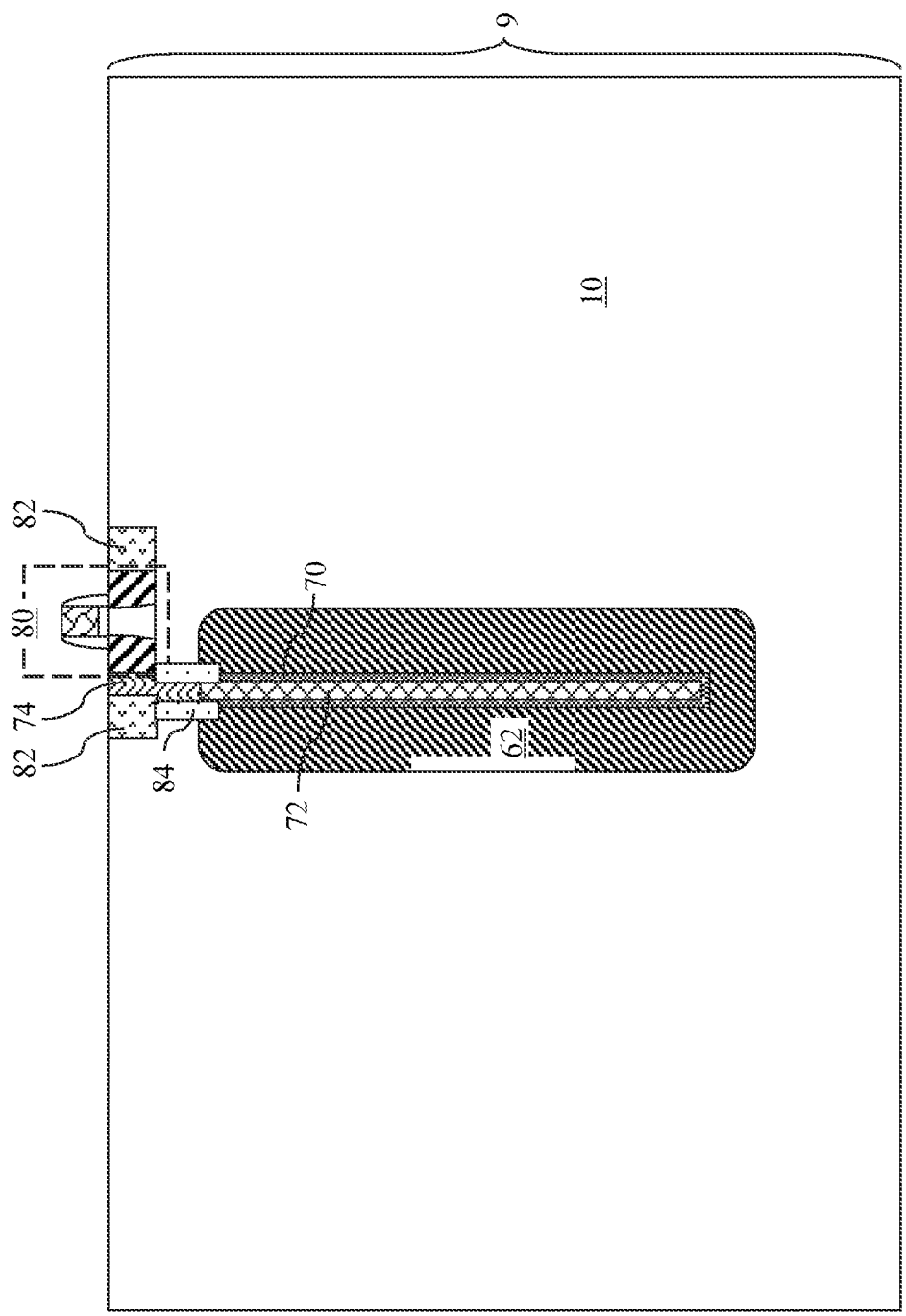
FIG. 11 is a vertical cross-sectional view of a second exemplary semiconductor structure according to a second embodiment of the present invention.

Referring to FIG. 11, a second exemplary semiconductor structure according to a second embodiment of the present invention is derived from the first exemplary semiconductor structure by employing a bulk substrate 9 instead of an SOI substrate. In this embodiment, the bulk substrate can be a single crystalline semiconductor material throughout. The same processing steps can be employed as in the first exemplary semiconductor structure provided that process parameters are adjusted to accommodate the absence of a buried insulator layer in the second exemplary semiconductor structure.

Figure 12:
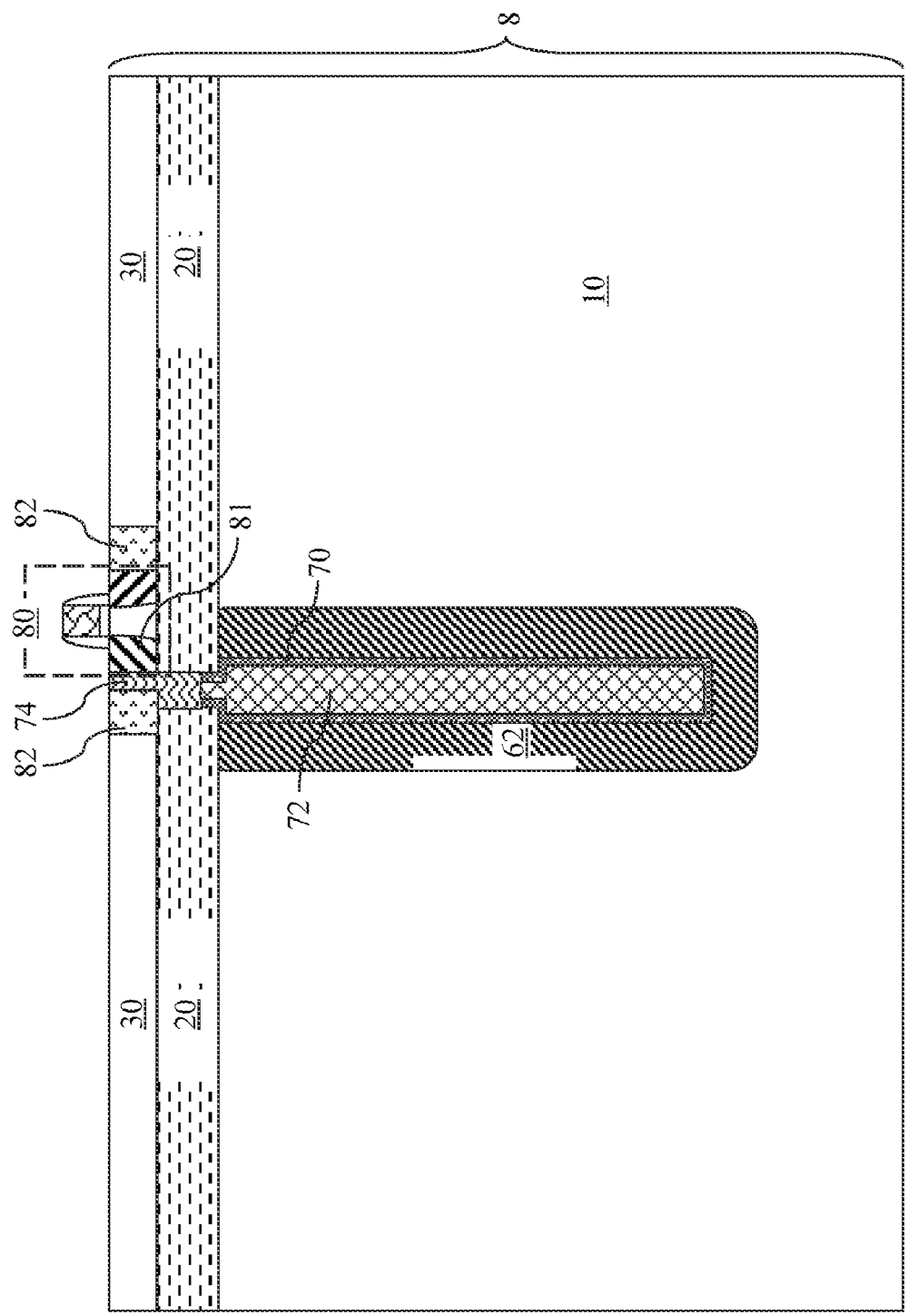
FIG. 12 is a vertical cross-sectional view of a third exemplary semiconductor structure according to a third embodiment of the present invention.

Referring to FIG. 12, a third exemplary semiconductor structure according to a third embodiment of the present invention can be derived from the first or second exemplary semiconductor structure by forming a bottle shaped deep trench, for example, by expanding a lower portion of the deep trench 12 after the processing step of FIG. 8 of the first embodiment employing methods known in the art.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a mask layer over a semiconductor substrate, wherein the semiconductor substrate is a semiconductor-on-insulator (SOI) substrate including a bottom semiconductor substrate, a buried insulator layer, and a top semiconductor substrate;
   forming an opening in said mask layer by patterning said mask layer;
   extending the opening through the top semiconductor substrate stopping on the buried insulator layer of the SOI substrate;
   implanting first dopant ions of a first polarity through said opening and said buried insulator layer into a first portion of the bottom semiconductor substrate of said semiconductor substrate, whereby a first doped region is formed underneath said opening;
   forming a trench through a portion of said first doped region by an anisotropic etch, wherein said trench extends downward from said opening through the buried insulator layer into the bottom semiconductor substrate; and
   implanting second dopant ions of a same polarity as the first polarity through a bottom surface and sidewall surfaces of said trench into a second portion of the bottom semiconductor substrate of said semiconductor substrate, wherein a second doped region is formed underneath said first doped region such that said second doped region and said first doped region are contiguous with each other.

2. The method of claim 1, further comprising extending said trench downward through a portion of said second doped region by a second anisotropic etch.

3. The method of claim 2, wherein said trench is extended downward without forming a step on any sidewall of said trench.

4. The method of claim 1, further comprising performing a combination of processing steps at least once after said extending said trench downward, wherein said combination of processing steps includes:
   implanting additional dopant ions through a bottom surface of said trench into another portion of the bottom semiconductor substrate of said semiconductor substrate, whereby another doped region is formed underneath said first and second doped region such that said other doped region is contiguously connected to said first doped region through at least one doped region; and
   extending said trench downward through a portion of said other doped region by an additional anisotropic etch.

5. The method of claim 4, wherein said combination of processing steps is repeated at least twice.

6. The method of claim 1, wherein said mask layer has a thickness that is greater than a first implantation depth of said first dopant ions and a second implantation depth of said second dopant ions.

7. The method of claim 1, wherein said first dopant ions and said second dopant ions are selected from ions of B, Ga, In, P, As, Sb, and compounds including at least one of B, Ga, In, P, As, Sb and at least another element.

8. The method of claim 1, wherein said bottom semiconductor substrate comprises a semiconductor material is selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

9. The method of claim 1, wherein said top semiconductor substrate has a thickness from 10 nm to 500 nm, and said buried insulator layer comprises silicon oxide and has a thickness from 10 nm to 500 nm.

10. The method of claim 1, further comprising etching a portion of said top semiconductor substrate underneath said opening by an anisotropic etch before implanting said first dopant ions.

11. The method of claim 1, wherein said mask layer is a dielectric material layer having a thickness from 500 nm to 3,000 nm.

12. The method of claim 11, wherein said mask layer comprises undoped silicate glass (USG) or a doped silicate glass.

13. The method of claim 1, wherein said first dopant ions and said second dopant ions are implanted in a direction that is normal to a top surface of said semiconductor substrate.

14. The method of claim 1, wherein a width of said opening is from 40 nm to 200 nm.

15. The method of claim 1, wherein a depth said trench is extended by a dimension from 500 nm to 2,000 nm by said anisotropic etch that etches through said portion of said first doped region.

16. The method of claim 1, further comprising forming a capacitor in said semiconductor substrate, wherein a volume of said first and second doped region outside said trench is included in a volume of a first electrode, a node dielectric is formed on sidewalls of said trench, and a conductive material portion constituting a second electrode is formed within said trench on sidewalls of said node dielectric.

17. The method of claim 16, further comprising a field effect transistor on said semiconductor substrate, wherein a source region of said field effect transistor is conductively connected to said second electrode.

18. The method of claim 1, wherein a p-n junction is formed at an outer boundary of said first and second doped regions, and said method further comprising annealing said semiconductor substrate after formation of said first and second doped region, whereby surfaces of said p-n junction becomes smoother during said annealing.

* * * * *